(12) United States Patent
Ruan et al.

(10) Patent No.: US 10,711,342 B2
(45) Date of Patent: Jul. 14, 2020

(54) METHOD OF PRODUCING SECONDARY LENS WITH HOLLOW NANO STRUCTURES FOR UNIFORM ILLUMINANCE

(71) Applicant: NATIONAL CHUNG SHAN INSTITUTE OF SCIENCE AND TECHNOLOGY, Taoyuan (TW)

(72) Inventors: Jian-Long Ruan, Taoyuan (TW); Shyh-Jer Huang, Taoyuan (TW); Yang-Kuo Kuo, Taoyuan (TW)

(73) Assignee: NATIONAL CHUNG SHAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 372 days.

(21) Appl. No.: 15/840,550

(22) Filed: Dec. 13, 2017

(65) Prior Publication Data
US 2019/0177833 A1  Jun. 13, 2019

(51) Int. Cl.
| | | |
|---|---|---|
| C23C 14/34 | (2006.01) | |
| G02B 1/12 | (2006.01) | |
| C23C 14/06 | (2006.01) | |
| C23C 14/08 | (2006.01) | |
| F21V 3/04 | (2018.01) | |

(52) U.S. Cl.
CPC .............. *C23C 14/34* (2013.01); *C23C 14/06* (2013.01); *C23C 14/08* (2013.01); *G02B 1/12* (2013.01); *F21V 3/049* (2013.01)

(58) Field of Classification Search
CPC . C23C 14/5873; C23C 14/0635; C23C 14/34; C23C 14/06; C23C 14/0641; C23C 14/024; G02B 5/0226; G02B 5/0247; G02B 5/0268; G02B 5/0278; G20B 5/0221

USPC .............................. 216/24, 26, 97, 101, 103
See application file for complete search history.

(56) References Cited

U.S. PATENT DOCUMENTS

| | | | | |
|---|---|---|---|---|
| 2011/0133061 | A1* | 6/2011 | Yu .......................... | B82Y 15/00 |
| | | | | 250/214.1 |
| 2014/0252313 | A1* | 9/2014 | Mariani .............. | H01L 31/1884 |
| | | | | 257/21 |
| 2015/0223328 | A1* | 8/2015 | Endoh ...................... | B32B 7/02 |
| | | | | 345/174 |
| 2018/0157058 | A1* | 6/2018 | Chou .................. | G02B 27/4205 |
| 2018/0341090 | A1* | 11/2018 | Devlin ................... | G02B 13/14 |
| 2019/0154877 | A1* | 5/2019 | Capasso .................. | G02B 3/02 |

\* cited by examiner

*Primary Examiner* — Binh X Tran
(74) *Attorney, Agent, or Firm* — Schmeiser, Olsen & Watts, LLP (57) ABSTRACT

A method of producing a secondary lens with hollow nano structures comprises the following steps (a) forming a polycrystalline seed layer on the surface of a lens; (b) growing a plurality of nano-rod structures over the polycrystalline seed layer in a random arrangement; (c) removing the portion of the seed layer where the nano-rod structure does not grow so that the surface of the lens therebeneath is exposed to outside; (d) sputtering a ceramic material layer over the plurality of nano-rod structures and the exposed surface portion of the lens; (e) removing the plurality of nano-rod structures and leaving a ceramic material layer having a plurality of hollow nano-rod structures in a random arrangement. A layer with hollow nano structures is formed on the surface of a lens wherein the hollow nano structures have the effect of scattering light and can improve the uniform illuminance of a secondary lens.

13 Claims, 7 Drawing Sheets

METHOD OF PRODUCING SECONDARY LENS WITH HOLLOW NANO STRUCTURES FOR UNIFORM ILLUMINANCE

FIELD OF THE INVENTION

The present invention relates to a method of producing a secondary lens, especially a method of producing a secondary lens with hollow nano structures for the uniform illuminance.

Besides challenges in epitaxy technology and element structure for ultraviolet light-emitting diode (UV LED), there are also many issues in packaging, and material selection and design for lens, such as, (1) the dependence of effective heat dissipation mechanisms to ensure the effectiveness and lifetime of the LED; the deficiency of traditional LED dissipation technology (for example, dissipation substrates, gel materials, dissipation fin designs) to cope with the applications in UV LED areas; (2) cracks and deterioration of packaging and lens materials exposed to the UV light wherein the traditional LED packaging materials are not suitable (for example, epoxy resin) due to the deterioration of illuminance, color temperature, and other optical features caused by yellowing problems. Therefore, the quality of packaging adhesive materials and lens materials directly affects the luminous efficacy and lifetime of the UV LED devices. In general, the potting materials are demanded to have high transmittance, high refractive index, good thermal stability, good fluidity, and easy to spray, in order to increase the reliability of the UV-LED package having the characteristics of low hygroscopicity, low stress, weather proof and environmental friendly.

BACKGROUND OF THE INVENTION

For the UV LED lens packaging, quartz glass has high transmittance (up to 95%); the next highest is silica gel (about 90%); the ultraviolet light transmittance of epoxy resin drops dramatically as the wavelength becomes shorter. The glass material requires extremely high temperature during the thermal process and therefore is not suitable for epitaxy packaging but for lens packaging. In order to have a packaging structure of high luminous efficacy and high reliability, the packaging gels and lens materials must select those having the characteristics of high UV light transmittance, good refractive index, high resistance to UV light, yellowing proof, high temperature resistance capability and good thermal stress. As the epitaxy technologies of LED progresses and matures, LEDs can increasingly meet the demand of diverse applications. Among various applications, owing to the characteristics of a point source of light, optical lenses must be used in order to obtain ideal light types. It is especially true in the application areas of high power LEDs. Before the lighting components of high power LEDs can actually become lighting products, the components generally need to undergo two optical designs. When the LED chips are packaged into LED photoelectric components, the first optical design is applied to solve the issues of light emitting angle, luminous intensity, luminous flux, luminous intensity distribution, range and distribution of color temperature. This is the first optical design. The secondary optical design focuses on the high power LED lighting. Generally a high power LED has a first optical lens with a light emitting angle of about 120°. The secondary optical design is to let the light that has been processed by the first optical lens pass through another optical lens to change the optical features of light. The goal of the first optical design is to maximize the light abstracting volume emitted by the LED chips; the goal of the secondary optical design is to adjust the light emitted from the completely integrated lighting device to meet the design requirements. Through the coordination of highly effective secondary optical lens, the deficiency in brightness, light emitting angle and uniform illuminance of the LED light source can be compensated in order to reduce the number of LED lights used.

The concept of nano structures has been widely applied to the upstream and downstream processes of the LED manufacturing. The main concept is that when light encounters the nano structure, the complete reflectivity of light is interfered by the shape of the nano structure, resulting in diffusion or reflection. In the upstream process of crystallite manufacturing, the nano structure patterned sapphire substrate can increase the light abstracting efficiency and reduce the epitaxy defects. In the downstream process of packaging, in order to cope with LED light apparatuses in the batwing type or concentrating type light applications, currently the international manufacturers mostly adopt the nano structure light diffuser films or the lens with nano structures of the secondary optical design. The manufacturing process of the nano structure light diffuser films generally creates V-shape cuts on an optical grade polymethylmethacrylate (PMMA) substrates. By changing the angle, size, and arrangement of the V-shape cuts to adjust and control the direction and uniformity of the emitted light, and obtain the effect of collimated light, contracted light, or diffused light according to different applications. In order to solve the problem of poor uniformity of the point source of LED light, the conventional method is to add diffusing particles in the PMMA thin films to increase the probability of light scattering. In addition, adding specially designed nano structure diffusing thin films, the emitting angle and uniformity of the LED light source can be controlled and adjusted within the ranges of applications. However, the disadvantage of such nano structure packaging of the secondary optical design is that the size is too huge.

In general, during the packaging process of the LED, a first optical design is applied. The standard lens is a conical lens. Majority of these lenses rely on total internal refection (TIR); thus these lenses are also called TIR lenses. A TIR lens has a design of axial symmetry to provide an excellent circular facula, so that not only a plurality of LEDs can be assembled into an array lens, but also a single LED with a support frame added is easy to be installed and adjust the light. If the requirement is a light source with uniform faculae, it can not be achieved simply by relying on the first optical design. Thus, a secondary optical design is required. Therefore, a light cover with a special structure or a secondary lens is designed for the applications in order to make the light emitted by LEDs to be focused more uniformly. On the other hand, by applying the special structure, the size of the conventional light focusing structure can be reduced to much smaller. Nevertheless, the special structure in the design of the light cover or the secondary lens makes the production process relatively complicated and requires the use of injection molding to increase the production efficiency. However, materials generally used in the injection molding are not suitable for the use of short wave light. Light of short wave, such as ultraviolet light, will cause damages to the materials. Therefore, light covers or secondary lenses in the secondary optical design will deteriorate and become brittle gradually as the usage time increases.

Therefore, currently the industry needs a method of producing secondary lens with hollow nano structures for uniform illuminance in order to solve the aforementioned poor uniformity problems of the point source of LED light and to enhance the characteristics of the secondary lens in high resistance to ultraviolet light, yellowing proof, and lifetime durability. The aforementioned method of the present invention replaces the materials of the special structure used in the light covers or secondary lens and simplifies the structure production process as an effective technology, thus to produce secondary lenses with hollow nano structures that are less expensive with a better scattering effect and can uniform faculae patterns significantly.

SUMMARY OF THE INVENTION

In view of the aforementioned disadvantages of the prior art, the main objective of the present invention is to provide a method of producing secondary lens with hollow nano structures for uniform illuminance. During the process of producing secondary lens with hollow nano structures for uniform illuminance, a plurality of nano-rod structures made of ceramic in a random arrangement are grown over the surface of the lens made of high transparent materials. Therefore, the special structures having an excellent effect of scattering light are provided to solve the problems of poor uniformity of the source of light and to increase the durability of materials used in the special structures of the secondary optical design.

To achieve the aforementioned objective, one solution based on the present invention is submitted to provide a method of producing secondary lens with hollow nano structures for uniform illuminance, which comprises the following steps: (a) forming a polycrystalline seed layer on the surface of a lens; (b) growing a plurality of nano-rod structures over the polycrystalline seed layer in a random arrangement; (c) removing the portion of the seed layer where the nano-rod structure does not grow so that the surface of the lens therebeneath is exposed to outside; (d) sputtering a ceramic material layer over the plurality of nano-rod structures and the exposed surface portion of the lens; (e) removing the plurality of nano-rod structures and leaving a ceramic material layer having a plurality of hollow nano-rod structures in a random arrangement.

As mentioned above, the lens in step (a) is made of high transparent materials, wherein the lens can be one of quartz, silicon dioxide, aluminum nitride (AlN), or diamond. The polycrystalline seed layer can be one of zinc oxide (ZnO), aluminum doped zinc oxide (AZO), aluminum and gallium co-doped ZnO (AGZO), or indium tin oxide (ITO). The present invention chooses to use the polycrystalline seed layer that is beneficial to the material in growing nano-rod structures in a random arrangement later.

As mentioned above, the nano-rod structures in step (b) can be one of zinc oxide (ZnO), aluminum doped zinc oxide (AZO), or aluminum and gallium co-doped ZnO (AGZO); the height of the nano-rod structure ranges between 1 μm~2 μm; the width of the nano-rod structure ranges between 100 nm-200 nm.

As mentioned above, the hydrothermal method is used in step (b) to create a plurality of nano-rod structures in a random arrangement, wherein the method of creating nano-rods of zinc oxide (ZnO) can be: selecting a solution type and a concentration to be hexamethylenetetramine ($C_6H_{12}N_4$) and 20 mM~30 mM respectively, zinc nitrate hexahydrate ($Zn(NO_3)_2 \cdot 6H_2O$) and 20 mM~30 mM respectively, and a process temperature of 80° C.~90° C. and a growth time of 4 hours~6 hours.

As mentioned above, acid etching can be used in step (c) to remove the aforementioned seed layer, wherein the acid solution can be selected from the group consisting of nitric acid, sulfuric acid, hydrochloric acid, phosphoric acid, boric acid and a combination thereof.

As mentioned above, the ceramic material layer in step (d) can be one of aluminum nitride (AlN), alumina ($Al_2O_3$), zirconium oxide ($ZrO_2$), silicon nitride ($Si_3N_4$), titanium dioxide ($TiO_2$), silicon carbide (SiC), zirconium carbide (ZrC), or tungsten carbide (WC).

As mentioned above, acid etching can be used in step (e) to remove the plurality of nano-rod structures, wherein the acid solution can be selected from the group consisting of nitric acid, sulfuric acid, hydrochloric acid, phosphoric acid, boric acid and a combination thereof.

The present invention relates to a method of producing a secondary lens with hollow nano structures for the uniform illuminance. By the aforementioned process, the present invention provides a secondary lens with hollow nano structures for the uniform illuminance; by the use of nano-rod structures made of ceramic in a random arrangement, the complicated and expensive production process and the poor durability of materials used in the special structures of the secondary optical design of the prior art can be avoided and solved.

The aforementioned summary of the invention and the following detail descriptions and drawings are for the purpose of better explaining the novel features, contents, methods and advantages of the present invention and the effect thereof in order to achieve the intended objectives. Other objectives and advantages of the present invention will be explained later along with the figures provided.

BRIEF DESCRIPTION OF THE DRAWINGS

To better understand the objectives, novel features, contents and advantages of the present invention and the effect thereof that can be achieved, detailed descriptions accompanied by the drawings of the present invention are provided as follows.

DETAILED DESCRIPTION OF THE PREFERRED EMBODIMENTS

The technical characteristics of the present invention is explained further by the detailed description given herein below by way of embodiments so that the technical characteristics, advantages, and the effect of the present invention become more fully understood to those skilled in the art to which the present invention described in the patent specification.

The present invention discloses a method of producing a secondary lens with hollow nano structures for the uniform illuminance wherein the method is to produce hollow nano-rod structures made of ceramic in a random arrangement over the surface of a lens; the aforementioned simple method is disclosed to produce special structures that have the effect of scattering light and can improve the uniform illuminance of the light source.

Figure 1:
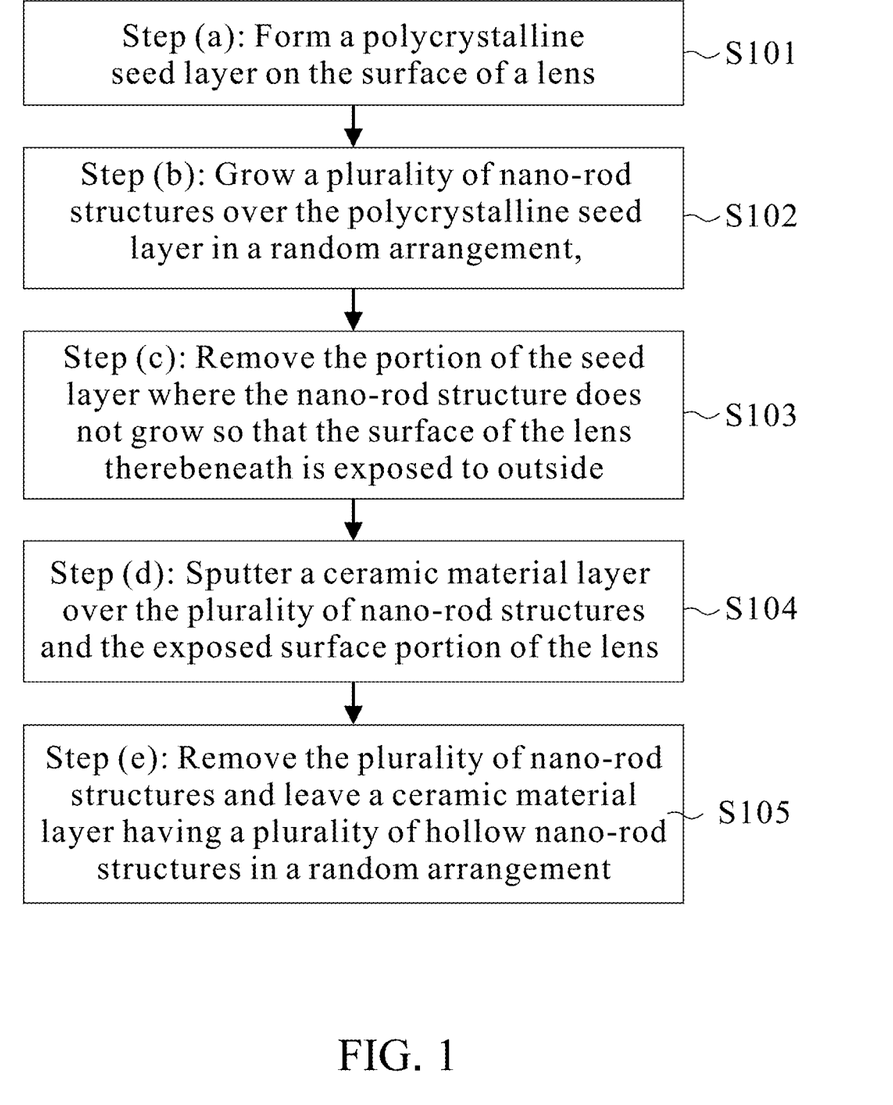
FIG. 1 is a flow chart of the method of producing a secondary lens with hollow nano structures for the uniform illuminance of the present invention.

Please refer to FIG. 1. FIG. 1 is a flow chart of the method of producing a secondary lens with hollow nano structures for the uniform illuminance of the present invention; As shown in the figure, the method of producing a secondary lens with hollow nano structures for the uniform illuminance comprises the following steps: (a) forming a polycrystalline seed layer on the surface of a lens, S101; (b) growing a plurality of nano-rod structures over the polycrystalline seed layer in a random arrangement, S102; (c) removing the portion of the seed layer where the nano-rod structure does not grow so that the surface of the lens therebeneath is exposed to outside, S103; (d) sputtering a ceramic material layer over the plurality of nano-rod structures and the exposed surface portion of the lens, S104; (e) removing the plurality of nano-rod structures and leaving a ceramic material layer having a plurality of hollow nano-rod structures in a random arrangement, S105.

EMBODIMENTS

Figure 2:
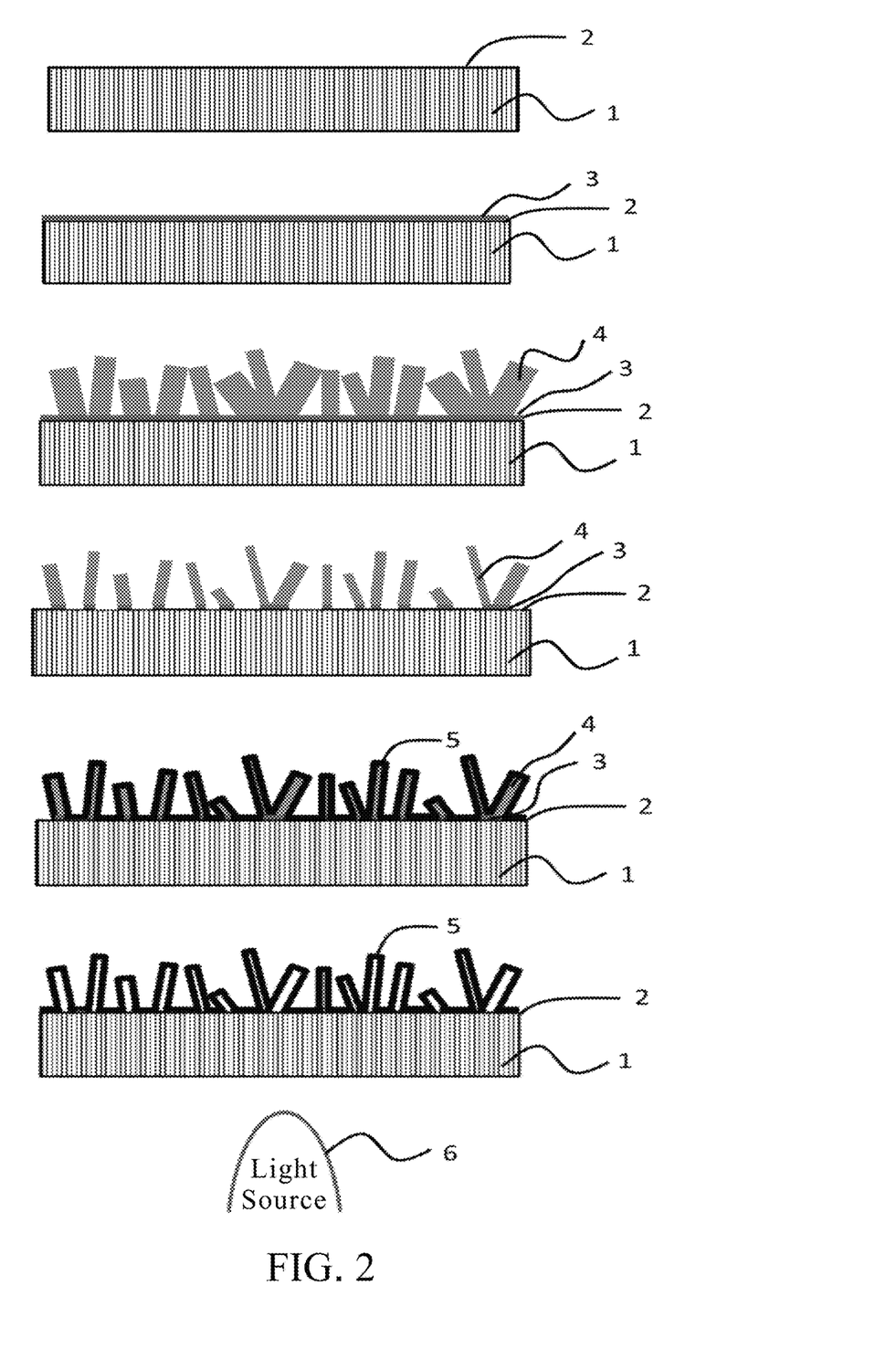
FIG. 2 is a flow chart consisting of a series of schematic diagrams of the method of producing a secondary lens with hollow nano structures for the uniform illuminance of the present invention.

Please refer to FIG. 2. FIG. 2 is a flow chart consisting of a series of schematic diagrams of the method of producing a secondary lens with hollow nano structures for the uniform illuminance of the present invention. The steps of the embodiment of the present invention include: (a) forming a polycrystalline seed layer 3 on the surface 2 of a lens 1, wherein the lens 1 is made of high transparent materials and the lens 1 can be one of quartz, silicon dioxide, aluminum nitride (AlN), or diamond. The polycrystalline seed layer 3 can be one of zinc oxide (ZnO), aluminum doped zinc oxide (AZO), aluminum and gallium co-doped ZnO (AGZO), or indium tin oxide (ITO); (b) growing a plurality of nano-rod structures 4 over the polycrystalline seed layer 3 in a random arrangement, wherein the nano-rod structures 4 can be one of zinc oxide (ZnO), aluminum doped zinc oxide (AZO), or aluminum and gallium co-doped ZnO (AGZO); the height of the nano-rod structure 4 ranges between 1 µm~2 µm; the width of the nano-rod structure 4 ranges between 100 nm~200 nm wherein the hydrothermal method can be used to create a plurality of nano-rod structures 4 in a random arrangement, wherein the method of creating nano-rods of zinc oxide (ZnO) can be: selecting a solution type and a concentration to be hexamethylenetetramine ($C_6H_{12}N_4$) and 20 mM~30 mM respectively, preferably 25 mM, zinc nitrate hexahydrate ($Zn(NO_3)_2 \cdot 6H_2O$) and 20 mM~30 mM respectively, preferably 25 mM, and a process temperature of 80° C.~90° C. and a growth time of 4 hours~6 hours; (c) removing the portion of the seed layer 3 where the nano-rod structure 4 does not grow so that the surface 2 of the lens 1 therebeneath is exposed to outside, wherein acid etching can be used to remove the seed layer 3 and the acid solution can be selected from the group consisting of nitric acid, sulfuric acid, hydrochloric acid, phosphoric acid, boric acid and a combination thereof; (d) sputtering a ceramic material layer 5 over the plurality of nano-rod structures 4 and the exposed surface 2 portion of the lens 1, wherein the ceramic material layer 5 can be one of aluminum nitride (AlN), alumina ($Al_2O_3$), zirconium oxide ($ZrO_2$), silicon nitride ($Si_3N_4$), titanium dioxide ($TiO_2$), silicon carbide (SiC), zirconium carbide (ZrC), or tungsten carbide (WC); (e) removing the plurality of nano-rod structures 4 and leaving a ceramic material layer 5 having a plurality of hollow nano-rod structures in a random arrangement, wherein acid etching can be used to remove the plurality of nano-rod structures 4 and the acid solution can be selected from the group consisting of nitric acid, sulfuric acid, hydrochloric acid, phosphoric acid, boric acid and a combination thereof. The secondary lens for the uniform illuminance produced in the embodiment of the present invention comprises a lens 1, a surface 2 of the lens, and a hollow nano structure layer in a random arrangement 5. Later, a light source 6 will be set up. In the embodiment, the light source 6 is a point source of light, preferably a LED.

Figure 3:
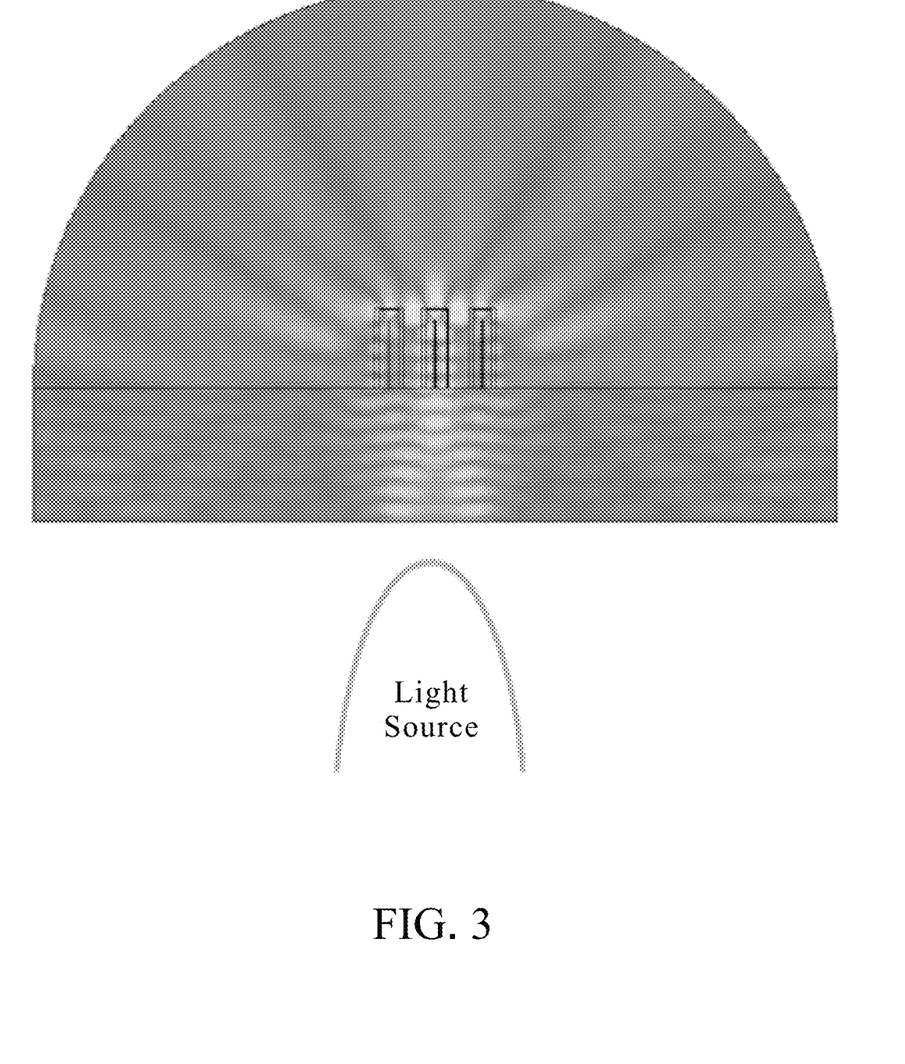
FIG. 3 is a simulation result using the vertical hollow nano-rod structures made of AlN radiated by a light source of 390 nm in one embodiment of the present invention.
Figure 4:
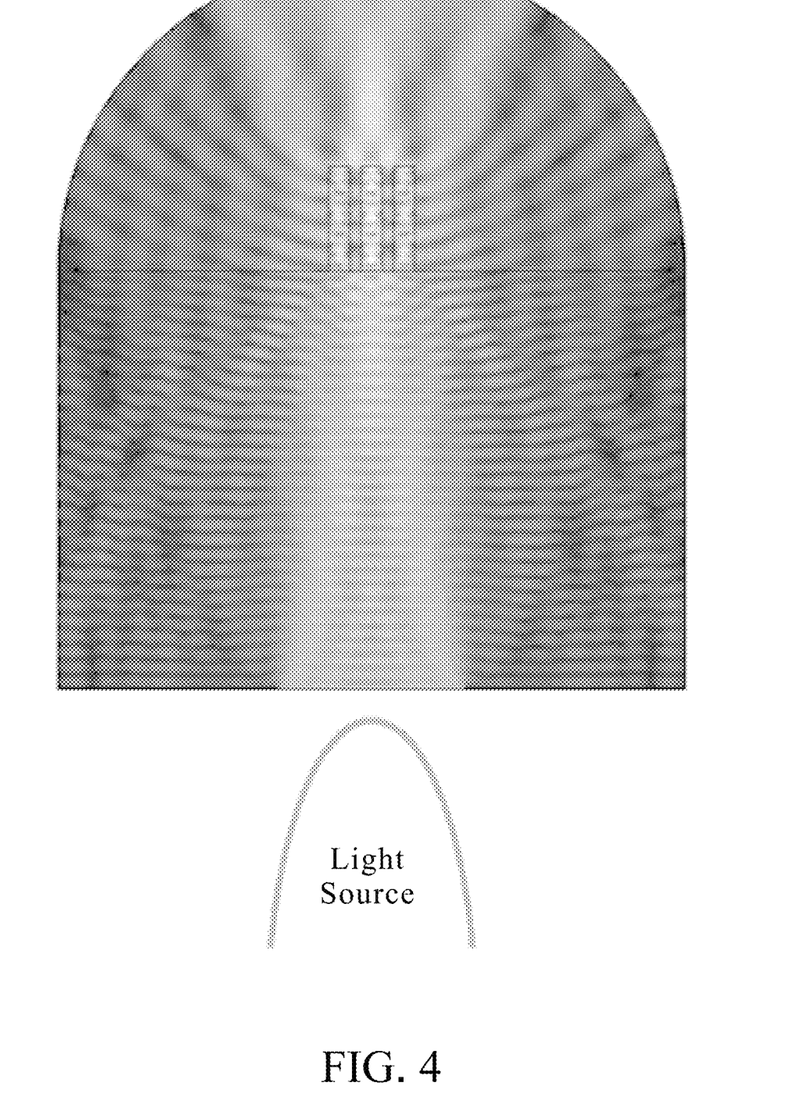
FIG. 4 is a simulation result using the vertical solid nano-rod v structures made of AlN radiated by a light source of 390 nm in one embodiment of the present invention.
Figure 5:
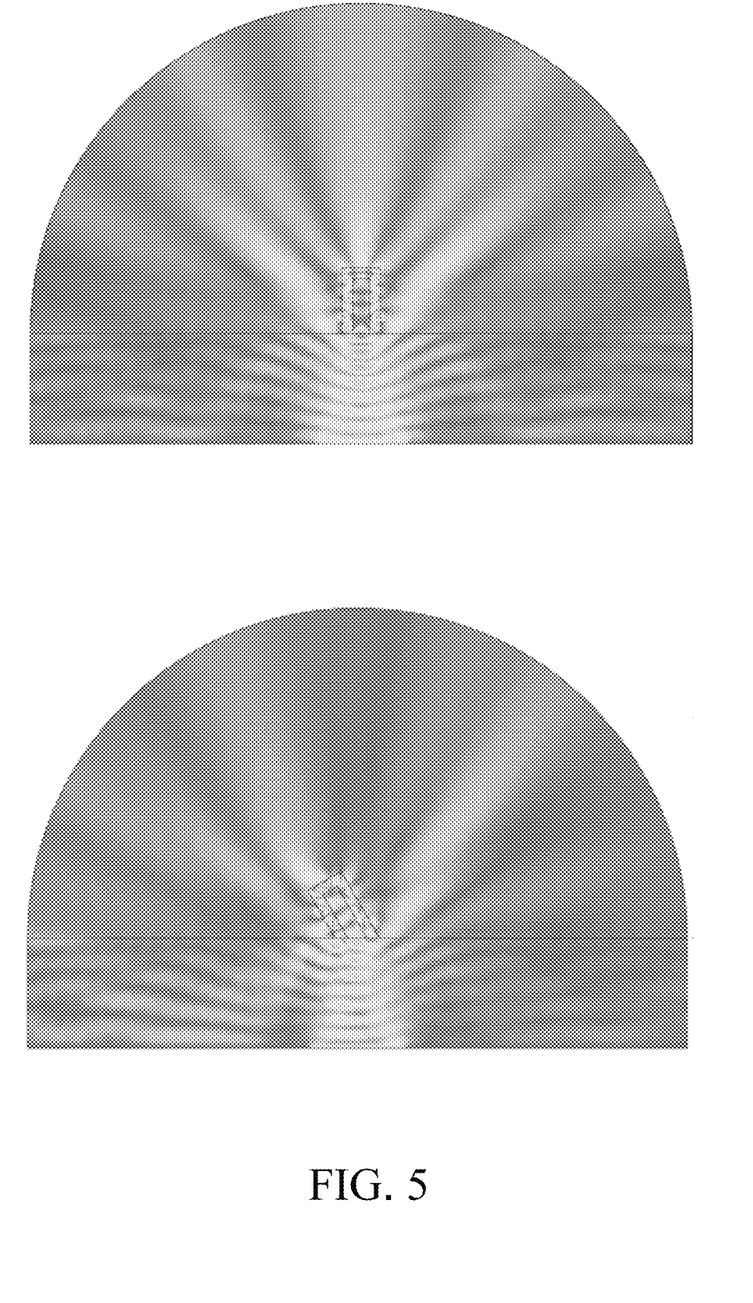
FIG. 5 is a simulation result using one hollow nano-rod structure made of AlN with a position inclined at 0 degree (vertical position) and 30 degrees to the vertical and radiated by a light source of 390 nm in one embodiment of the present invention.
Figure 6:
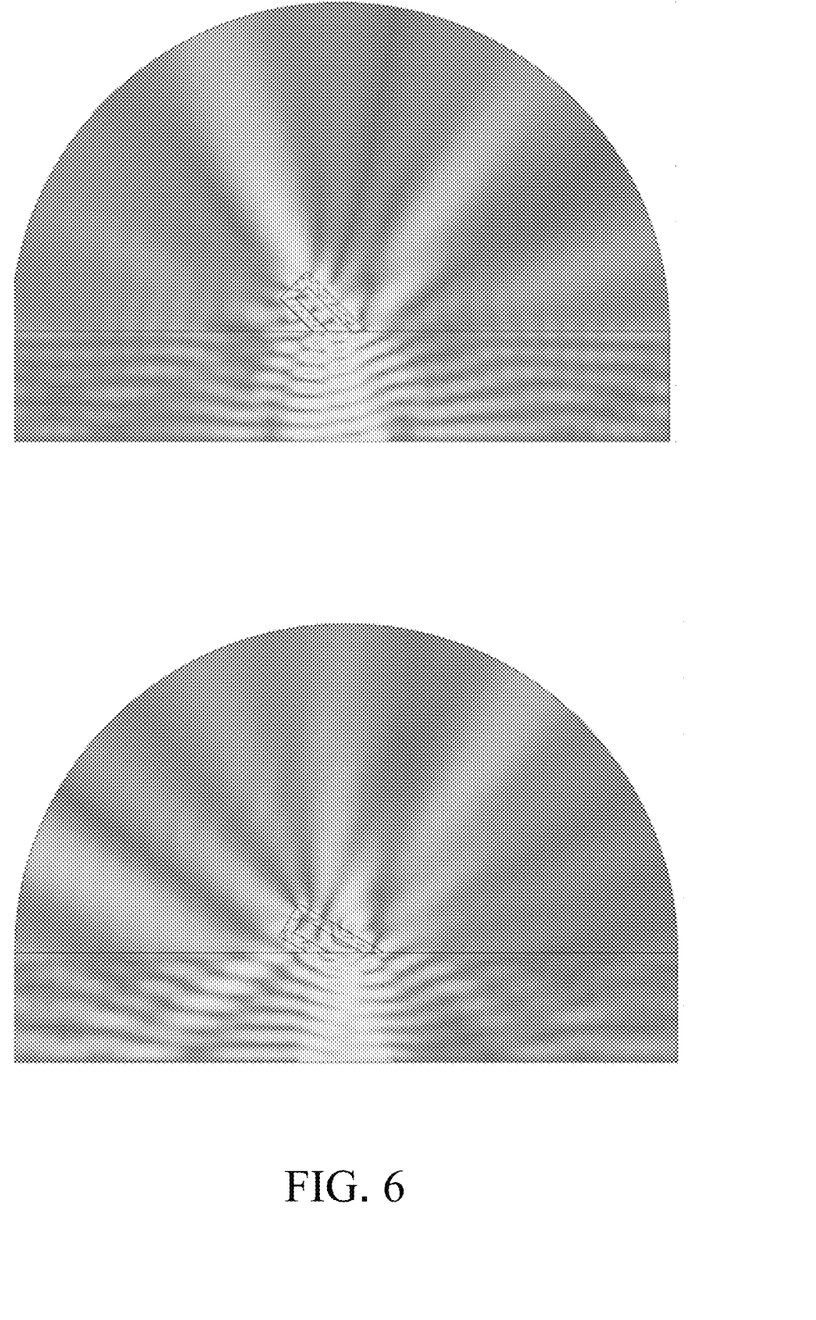
FIG. 6 is a simulation result using one hollow nano-rod structure made of AlN with a position inclined at 45 degrees and 60 degrees to the vertical and radiated by a light source of 390 nm in one embodiment of the present invention.
Figure 7:
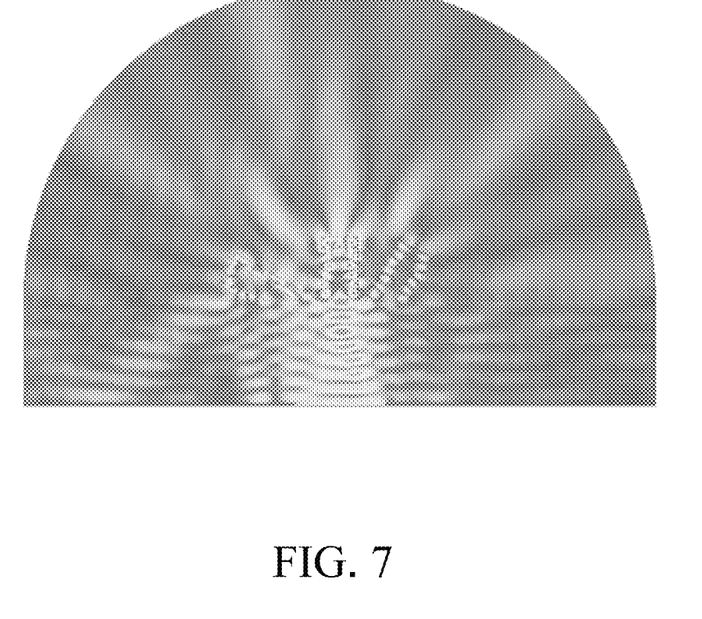
FIG. 7 is a combination of simulation results using one hollow nano-rod structure made of AlN with a position inclined at 0 degree, 30 degrees, and 60 degrees to the vertical and radiated by a light source of 390 nm in the embodiments of the present invention.

Please refer to FIG. 3. FIG. 3 is a simulation result using the vertical hollow nano-rod structures made of AlN radiated by a light source of 390 nm in one embodiment of the present invention. Please also refer to FIG. 4. FIG. 4 is a simulation result using the vertical solid nano-rod structures made of AlN radiated by a light source of 390 nm in one embodiment of the present invention. By comparison between the simulation results of FIG. 3 and FIG. 4, the results show that after the focused light passes by and through three units vertical hollow nano-rod structures made of AlN, the light scatters uniformly at a distance away, whereas after the focused light passes by the vertical solid nano-rod structures made of AlN, the light does not scatter uniformly at a distance away, that is the uniform illuminance is low. Both FIG. 5 and FIG. 6 illustrate the simulation results using one hollow nano-rod structure made of AlN with a position inclined at 0 degree (vertical position) and 30 degrees (in FIG. 5), and 45 degrees and 60 degrees (in FIG. 6) to the vertical and radiated by a light source of 390 nm, respectively. By comparison between the simulation results of FIG. 5 and FIG. 6, the results show that although the light scatters after passing through the vertical hollow nano-rod structures, the symmetrical distribution of uniform illuminance thereof remains visually identifiable. Therefore, the simulation results demonstrate that if only vertical hollow nano-rod structures in an overall ordered arrangement are used as the special secondary optical structure, the uniform illuminance of the scattered light is limited. When the hollow nano-rod structures with a position inclined at 30 degrees to the vertical, the originally focused light is directed to the side and is not symmetrical. When the hollow nano-rod structures with a position inclined at 45 degrees and 60 degrees respectively to the vertical, the light intends to scatter. The phenomenon is especially obvious when the incline is at 60 degrees. Thus, when the hollow nano-rod structures in an random arrangement is applied, a light scattering phenomenon appears, as shown in FIG. 7 (a combination of simulation results using one hollow nano-rod structure made of AlN with a position inclined at 0 degree, 30 degrees, and 60 degrees to the vertical and radiated by a light source of 390 nm in the embodiments of the present invention). To compare the distribution of uniform illuminance of the scattered light in FIG. 7 to that in FIG. 3 when the vertical hollow nano-rod structures are applied, the former shows an obvious improvement. The more random the arrangement is, the higher uniform illuminance of the light source is.

The present invention provides a method of producing secondary lens with hollow nano structures for uniform illuminance. According to the illustrations of the aforementioned embodiments, the lens of the present invention is made of high transparent materials; a polycrystalline seed layer is formed on the surface of the lens; a plurality of nano-rod structures are grown over the polycrystalline seed layer in a random arrangement; after sputtering a ceramic material layer, acid etching is used to produce a plurality of hollow nano-rod structures in a random arrangement; and finally, the lens can be placed in from of a point source of light to uniform the field of light.

Therefore, this patent application can provide a method of producing a secondary lens with hollow nano structures for the uniform illuminance, effectively solve the problems of complicated and expensive production process and the poor durability of materials used in the special structures of the secondary optical design of the prior art. The method can be directly applied to produce secondary optical material elements and broaden the implementation areas thereof in the future.

The aforementioned preferred embodiments are presented to disclose the novel features, effects, and advantages of the present invention. Those skilled in the art shall understand that the aforementioned descriptions are for illustration only and for the utilization of the invention for various modifications as suitable for specific applications, and shall not be interpreted to limit the scope, applicability or configuration, of the present invention in any way. The scope of the claims of the present invention are listed in the following claims; any alternative embodiments that are modified or changed without departing from the spirit and scope of the present invention shall be included in the appended claims.

What is claimed is:

1. A method of producing a secondary lens with hollow nano structures for uniform illuminance, comprising the following steps:
   (a) forming a polycrystalline seed layer on the surface of a lens;
   (b) growing a plurality of rod structures over the polycrystalline seed layer in a random arrangement;
   (c) removing the portion of the seed layer where the rod structure does not grow so that the surface of the lens therebeneath is exposed to outside;
   (d) sputtering a ceramic material layer over the plurality of rod structures and the exposed surface portion of the lens;
   (e) removing the plurality of rod structures and leaving a ceramic material layer having a plurality of hollow rod structures in a random arrangement.

2. The method of producing a secondary lens with hollow nano structures for the uniform illuminance as claimed in claim 1, wherein the lens in step (a) is one of quartz, silicon dioxide, aluminum nitride (AlN), and diamond.

3. The method of producing a secondary lens with hollow nano structures for the uniform illuminance as claimed in claim 1, wherein the polycrystalline seed layer in step (a) is one of zinc oxide (ZnO), aluminum doped zinc oxide (AZO), aluminum and gallium co-doped ZnO (AGZO), and indium tin oxide (ITO).

4. The method of producing a secondary lens with hollow nano structures for the uniform illuminance as claimed in claim 1, wherein a height of the rod structure ranges between 1 μm and 2 μm; a width of the rod structure ranges between 100 nm and 200 nm.

5. The method of producing a secondary lens with hollow nano structures for the uniform illuminance as claimed in claim 1, wherein a hydrothermal method is used in step (b) to create a plurality of rod structures in a random arrangement.

6. The method of producing a secondary lens with hollow nano structures for the uniform illuminance as claimed in claim 1, wherein a hydrothermal method is used in step (b) to create a plurality of rod structures of zinc oxide (ZnO) using a solution type and a concentration to be hexamethylenetetramine ($C_6H_{12}N_4$) and 20 mM-30 mM respectively, zinc nitrate hexahydrate ($Zn(NO_3)_2 \cdot 6H_2O$) and 20 mM-30 mM respectively, and a process temperature of 80° C.-90° C. and a nano-rod growth time of 4 hours-6 hours.

7. The method of producing a secondary lens with hollow nano structures for the uniform illuminance as claimed in claim 1, wherein the ceramic material layer in step (d) is one of aluminum nitride (AlN), alumina ($Al_2O_3$), zirconium oxide ($ZrO_2$), silicon nitride ($Si_3N_4$), titanium dioxide ($TiO_2$), silicon carbide (SiC), zirconium carbide (ZrC), and tungsten carbide (WC).

8. The method of producing a secondary lens with hollow nano structures for the uniform illuminance as claimed in claim 1, wherein the rod structures in step (b) are one of zinc oxide (ZnO), aluminum doped zinc oxide (AZO), and aluminum and gallium co-doped ZnO (AGZO).

9. The method of producing a secondary lens with hollow nano structures for the uniform illuminance as claimed in claim 8, wherein a height of the rod structure ranges between 1 μm and 2 μm; a width of the rod structure ranges between 100 nm and 200 nm.

10. The method of producing a secondary lens with hollow nano structures for the uniform illuminance as claimed in claim 1, wherein acid etching is used in step (c) to remove the aforementioned seed layer.

11. The method of producing a secondary lens with hollow nano structures for the uniform illuminance as claimed in claim 10, wherein the acid solution is selected from the group consisting of nitric acid, sulfuric acid, hydrochloric acid, phosphoric acid, boric acid and a combination thereof.

12. The method of producing a secondary lens with hollow nano structures for the uniform illuminance as claimed in claim 1, wherein acid etching used in step (e) removes the plurality of rod structures.

13. The method of producing a secondary lens with hollow nano structures for the uniform illuminance as claimed in claim 12, wherein the acid solution is selected from the group consisting of nitric acid, sulfuric acid, hydrochloric acid, phosphoric acid, boric acid and a combination thereof.

* * * * *